United States Patent [19]

Asanasavest

[11] Patent Number: 5,437,405

[45] Date of Patent: Aug. 1, 1995

[54] METHOD AND APPARATUS FOR STITCH BONDING OF WIRES TO INTEGRATED CIRCUIT BONDING PADS

[75] Inventor: Chainarong Asanasavest, Santa Clara, Calif.

[73] Assignee: National Semiconductor Corporation, Santa Clara, Calif.

[21] Appl. No.: 293,822

[22] Filed: Aug. 22, 1994

[51] Int. Cl.6 .............................................. B23K 31/02
[52] U.S. Cl. .................... 228/180.5; 228/4.5
[58] Field of Search ................. 228/180.5, 4.5, 44.7

[56] References Cited

U.S. PATENT DOCUMENTS 4,219,143  8/1980  Gaillano ............................ 228/4.5
4,475,681  10/1984  Ingle ................................ 228/180.5

FOREIGN PATENT DOCUMENTS

2-125631A  5/1990  Japan ............................... 228/180.5
2146937A   5/1985  United Kingdom ............. 228/180.5

Primary Examiner—Mark Rosenbaum
Assistant Examiner—Jeffrey T. Knapp
Attorney, Agent, or Firm—Hickman & Beyer

[57] ABSTRACT

A method is presented for stitch bonding wires to bonding pads on integrated circuit dies by using a tilted bonding capillary tip to prevent damaging the dies. The capillary tip has a face surface about the opening of the capillary. The face surface makes a face angle with respect to a capillary axis. The capillary tip is positioned in proximity to a bonding pad, and the tip is tilted by an angle less than the face angle. An end of a bonding wire is then stitch bonding to the bonding pad without damaging passivation layers on the integrated circuit die which surround the bonding pad. An apparatus permitting ball bonding and stitch bonding at a plurality of angular orientations is also disclosed. The invention should be particularly useful for electrically connecting integrated circuit dies to each other in multi-chip packages (MCP's).

7 Claims, 7 Drawing Sheets

METHOD AND APPARATUS FOR STITCH BONDING OF WIRES TO INTEGRATED CIRCUIT BONDING PADS

BACKGROUND OF THE INVENTION

The present invention relates generally to the packaging of integrated circuits and more particularly to bonding wires to integrated circuit bonding pads.

Semiconductor integrated circuits are currently mass produced for a broad range of purposes. Therefore, continual cost and quality improvements in their manufacturer are valuable and could have broad applicability.

In recent years, multi-chip modules (MCM's) or multi-chip packages (MCP's) containing more than one integrated circuit die have become widely used because complex components can be made by simply connecting multiple dies to each other within a single package. The terms multi-chip module (MCM) and multi-chip package (MCP) will be considered synonymous throughout this application.

To connect dies to each other in MCP's, one must connect the bonding pads of different dies. The ball-stitch technique has been of limited use for bonding wires with both ends connected to integrated circuit bonding pads because capillary tips are typically larger in diameter than the bonding pads. The capillary tip can crack the protective passivation layer(s) surrounding the pads and coating the chip thus permitting corrosion of the integrated circuit underneath. The tip itself can also damage the integrated circuit while cracking the passivation layer(s).

Figure 1:
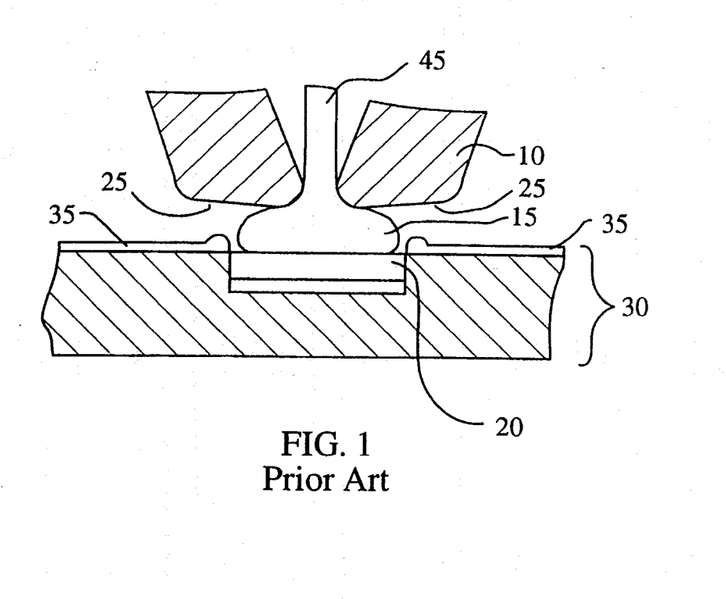
FIG. 1 is a diagrammatic side cross section of a capillary tip forming a conventional ball bond to an integrated circuit bonding pad.
Figure 2:
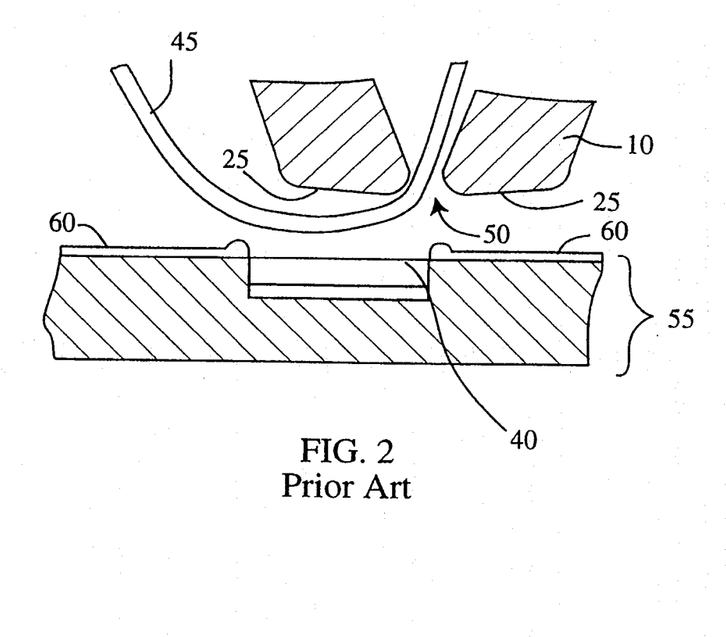
FIG. 2 is a diagrammatic side cross section of a capillary tip prior to forming a conventional stitch bond to an integrated circuit bonding pad.
Figure 3:
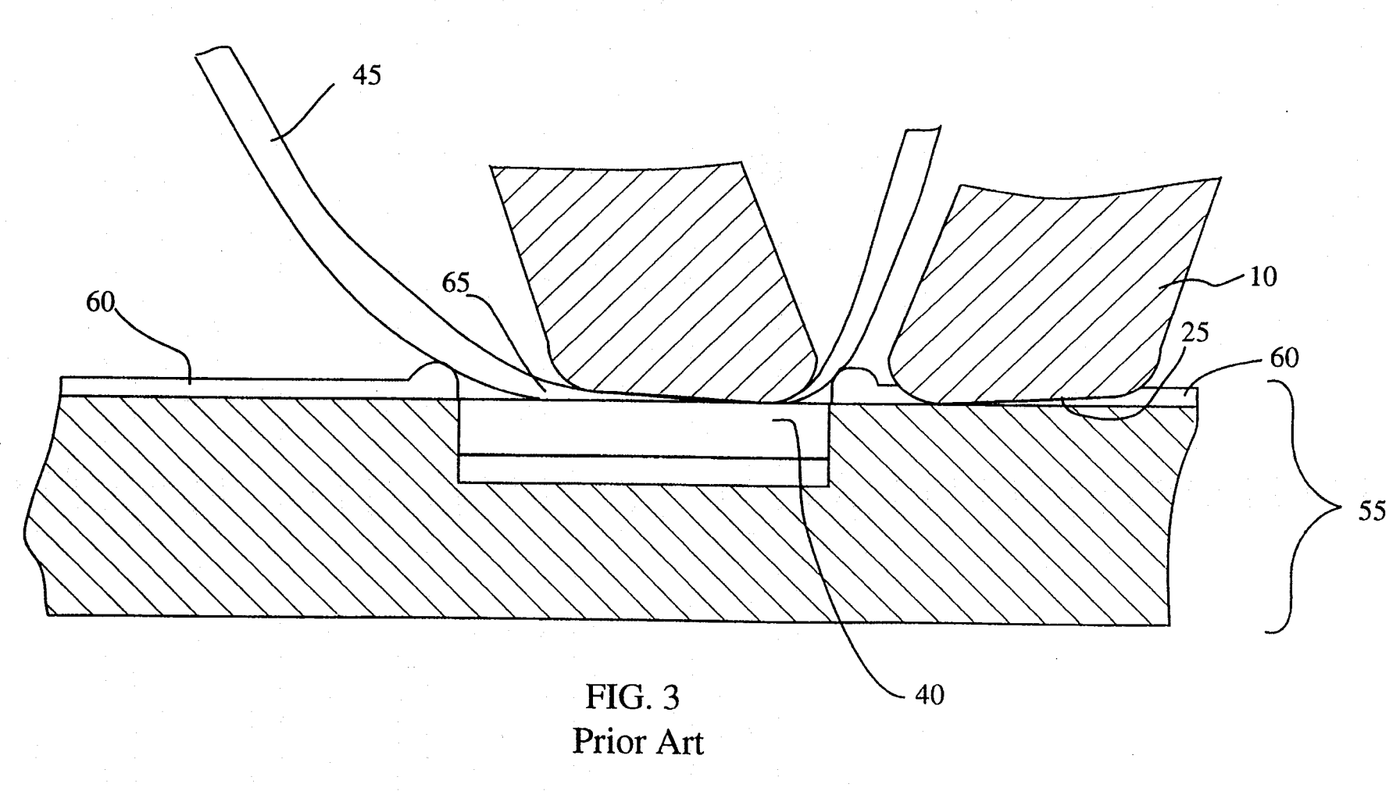
FIG. 3 is a diagrammatic side cross section of a capillary tip forming a conventional stitch bond to an integrated circuit bonding pad.

A conventional attempt to use ball-stitch bonding to connect integrated circuit bonding pads to each other is illustrated in FIGS. 1–3. FIG. 1 shows a bonding capillary tip 10 forming a ball bond 15 on a bonding pad 20. The bonding capillary tip 10 has a face 25 with a face surface. The face 25 surrounds an opening of the capillary through which a wire bonding material exudes to form the ball bond 15. Gold is a typical wire bonding material used for making ball bonds.

The bonding pad 20 resides at a surface of an integrated circuit chip 30. Although the bonding pad 20 is shown as having only two layers, it may normally have four or five layers. A layer of the bonding pad 20 may typically be made of an aluminum/silicon compound.

In addition to the bonding pad, the integrated circuit chip 30 has a passivation layer 35 on its exterior. The passivation layer 35 protects the integrated circuit underneath from damage and corrosion. If the passivation layer 35 were to become cracked or damage, the circuit on the integrated circuit chip 30 would be exposed. Additionally, the act of damaging the passivation layer 35 could very well damage the substrate beneath the passivation layer and therefore damage the integrated circuit directly.

After forming the ball or first bond 15 of a bonding wire as shown in FIG. 1, a bonding wire 45 is exuded from the bonding capillary tip 10 as it is positioned in proximity to second bonding pad 40 as shown in FIG. 2. The bonding wire 45 trails out of the opening 50 of the bonding capillary during this positioning step. Generally, in the construction of MCP's, one wants to connect bonding pads of distinct integrated circuit dies. Therefore, the second bonding pad 40 has generally been on a second integrated circuit chip 55 with its own passivation layer 60.

FIG. 3 shows a conventional attempt to make a stitch bond on the second bonding pad 40. Notice that the face 25 of the bonding capillary tip 10 has penetrated the passivation layer 60. Thus, the ultrasonic welding of the bonding wire 45 to form a stitch bond 65 on the second bonding pad 40 will leave a damaged passivation layer 60 with the concomitant problems of an exposed integrated circuit on the chip 55.

A better method for welding bonding wires to bonding pads with both ball and stitch bonds is desirable. Such a method would permit the usage of a single wire bonding machine to create both ball and stitch bonds with the same bonding wire. This transference of a technique previously used primarily to connect integrated circuit chips to lead frames will allow one wire bonding machine both to connect multiple integrated circuit chips to each other and to connect chips to a lead frame. If this new technique were to leave the passivation layers intact, the corrosion and other damage problems caused by current attempts to stitch bond to bonding pads would be obviated.

SUMMARY OF THE INVENTION

To achieve the foregoing and other objects and in accordance with the purpose of the present invention, a method of bonding wires to integrated circuit bonding pads is disclosed such that a capillary tip is tilted during the formation of a stitch bond. The capillary tip is positioned in proximity to a bonding pad of an integrated circuit die. The capillary tip has a face surface about an opening of the bonding capillary which makes a face angle with respect to a capillary axis aligned with the opening. The capillary is rotated by an angle less than the face angle to prevent a portion of the face surface from contacting the integrated circuit die during a subsequent welding of a bonding wire to the bonding pad. In this way, a stitch bond is formed at the bonding pad without damaging the integrated circuit die.

In an apparatus aspect of the invention, a wire bonding apparatus for electrically connecting bonding wires to integrated circuit bonding pads is disclosed. The apparatus includes a wire bonding machine and a support for angularly orienting and translating one of the capillary tip and the integrated circuit bonding pads relative to the other. The wire bonding machine has a bonding capillary with an opening, a face about the opening, and a face surface. The wire bonding machine exudes a bonding wire supplied through the bonding capillary out of the opening to form ball bonds and stitch bonds. The apparatus enables wire bonding at various angular orientations of the capillary tip and face surface with respect to the bonding pads to permit both ball bonding and stitch bonding without damaging areas of the integrated circuit dies.

This invention should be particularly useful for electrically connecting integrated circuit dies to each other in multi-chip packages (MCP's). In a preferred embodiment, a bonding wire will electrically connect two dies with a ball bond on one die and a stitch bond on the other die without damaging either die.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

A method for connecting integrated circuit bonding pads by bonding wires having both ball and stitch bonds will be disclosed. This technique significantly reduces or obviates the problems associated with damaged passivation layers and provides reliable stitch wire bonds. The method of the present invention is particularly useful in the manufacturer of multi-chip packages (MCP's). In MCP's the integrated circuit chips are generally connected to each other as well as being connected to a lead frame.

Figure 4:
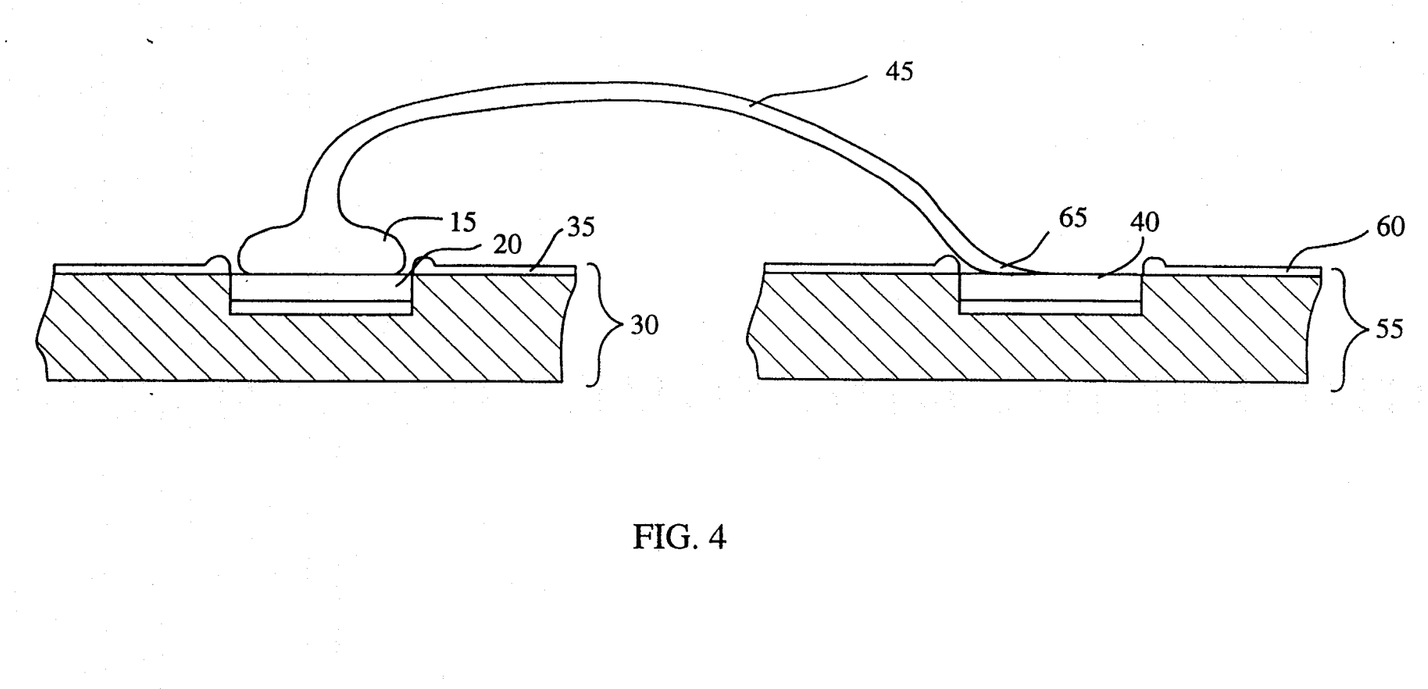
FIG. 4 is a diagrammatic side cross section of a bonding wire having both a ball bond and a stitch bond and formed by the method of the present invention.

FIG. 4 shows a bonding wire 45 connecting a first bonding pad 20 and a second bonding pad 40 resulting from the method of the present invention. The ball or first bond 15 is generally formed before the second or stitch bond 65. The ball bond 15 may be formed by conventional methods as described in the background section. However, the stitch bond 65 is formed by a new technique for stitch bonds. Although integrated circuit chips 30 and 55 will generally be distinct, it may be desirable for the bonding wire 45 to connect bonding pads 20 and 40 on the same integrated circuit chip. Using the method of the present invention, the passivation layers 35 and 60 are left intact. Therefore, the corrosion and damaged problems associated with conventional methods are avoided.

Figure 5:
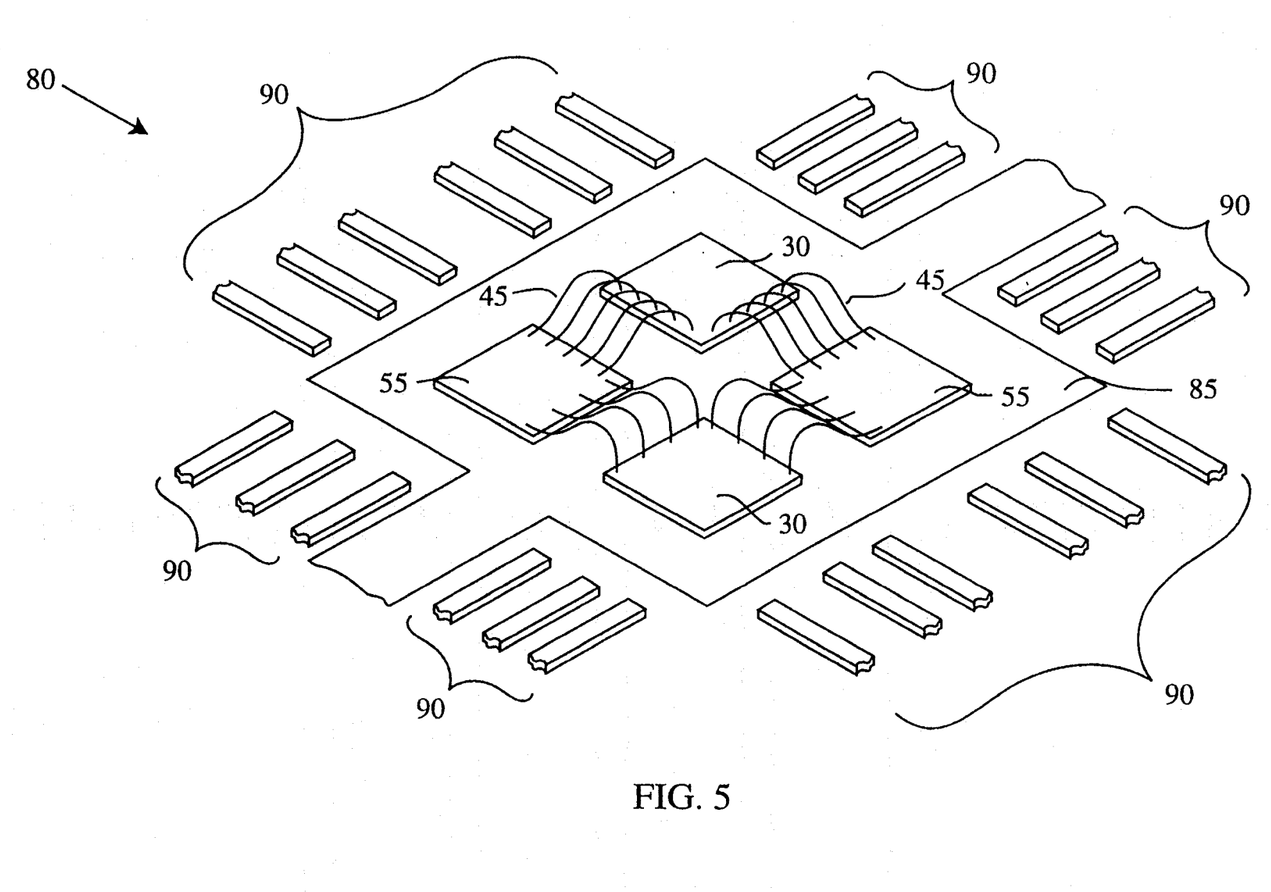
FIG. 5 is a perspective view of a multi-chip package with bonding pads connected by wires having ball and stitch bonds.

FIG. 5 is a diagrammatic representation of a multi-chip package 80 having bonding wires 45 made in accordance with the method of the present invention. For illustrative purposes only, all of the bonding wires 45 have ball bonds on the two integrated circuit chips 30 and stitch bonds on the integrated circuit chips 55. As previously noted, the bonding wires 45 may connect bonding pads on the same integrated circuit chips (not shown). In FIG. 5 the chips 30 and 55 are all on a die attach pad (DAP) 85. Although not shown in the figure, the integrated circuit chips 30 and 35 will be connected to leads 90 of a lead frame to permit electrical connections to external circuitry.

Beginning with FIG. 6, a method of the invention for forming a stitch bond 65 on a second bonding pad 40 will be described in detail. As just described, the stitch bond 65 will generally be formed after the formation of the first or ball bond 15. In a positioning step, the bonding capillary 10 will be positioned in proximity to the second bonding pad 40 on an integrated chip 55.

Figure 6:
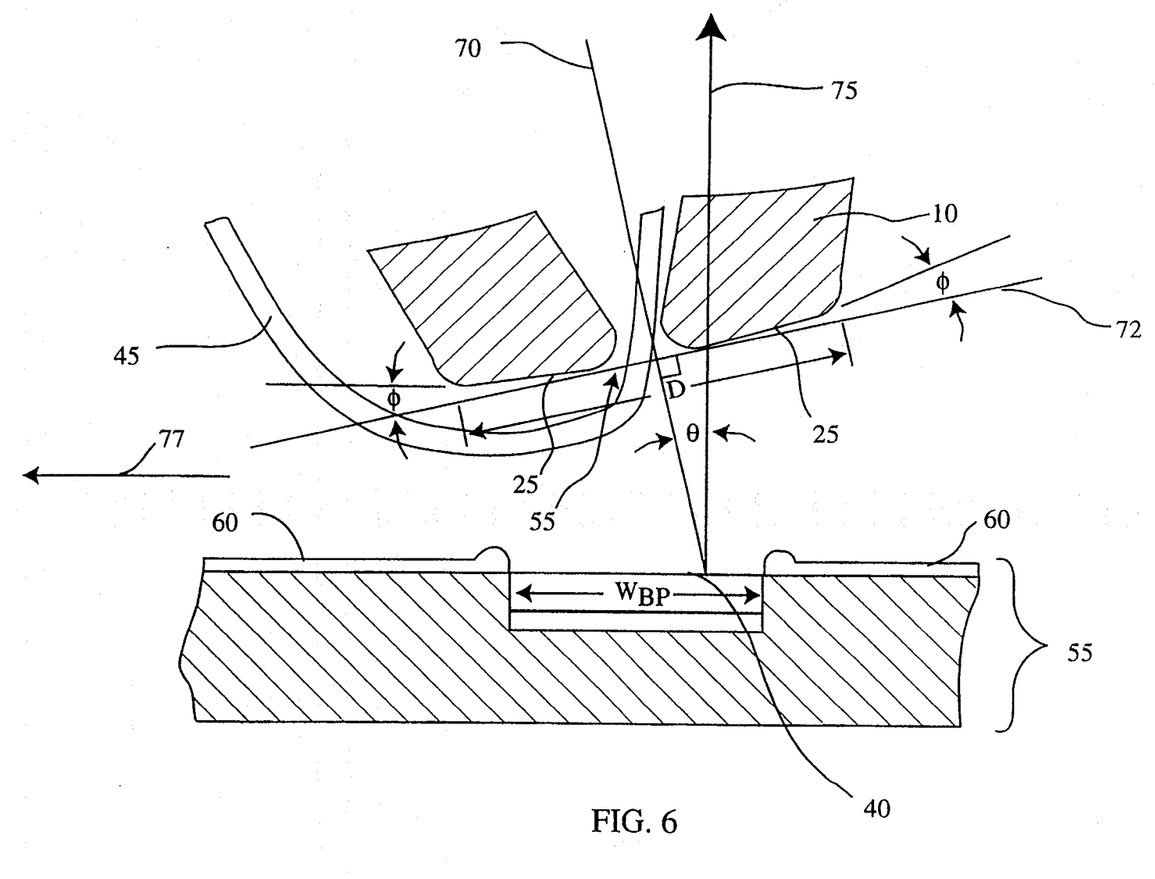
FIG. 6 is a diagrammatic side cross section of a tilted capillary tip positioned in proximity to an integrated circuit bonding pad illustrating positioning and tilting steps of the present invention.

Although FIG. 6 shows a dramatic enlargement of a capillary tip 10, the bonding capillary is a small conduit which defines a capillary axis 70 along its length. The capillary axis 70 is aligned with the opening of the bonding capillary 55 through which the bonding wire 45 exudes. In a preferred embodiment, the opening 55 will be circular. The capillary tip is also has a face 25 on its distal end which is used as a striking surface during ultrasonic welding. For illustrative purposes, the face 25 will be assumed to be cylindrically symmetric about the capillary axis 70 and have essentially one face surface about the opening 55. A face plane 72 can be constructed perpendicular to the capillary axis 70. Thus defined, the face surface will have a face angle phi ($\phi$) with respect to the face plane 72.

In the art, a capillary diameter D is defined as the projection of the face 25 onto the face plane 72. The technique of the invention is particularly useful when the diameter D of the capillary tip 10 is larger than a width $W_{BP}$ of the second bonding pad 40. In that case, the capillary will be more prone to damage passivation layers 60 surrounding the bonding pad 40.

Figure 7:
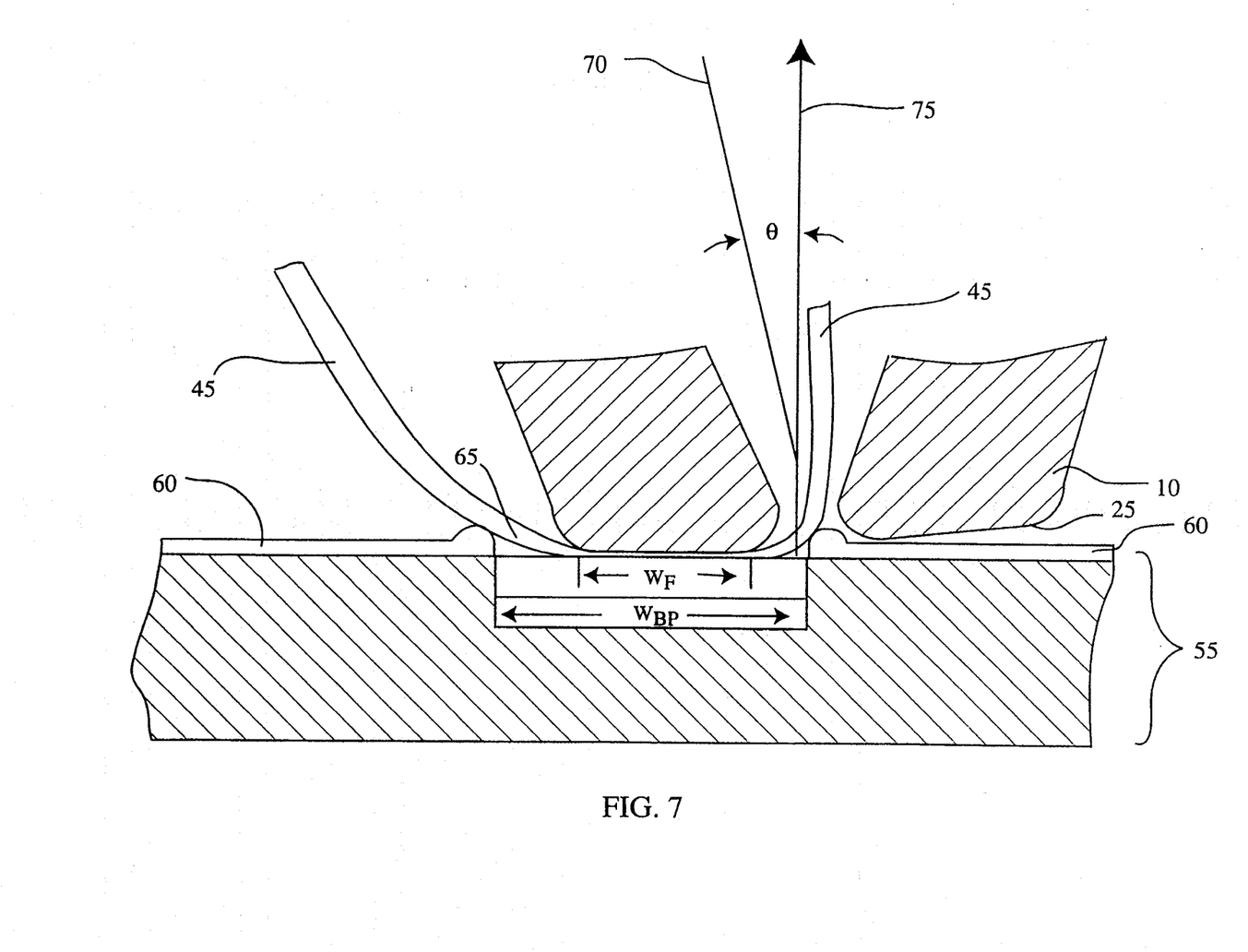
FIG. 7 is a diagrammatic side cross section of a capillary tip forming a stitch bond to an integrated circuit bonding pad illustrating a welding step of the present invention.

One could also define a face width $W_F$ (as shown in FIG. 7) of the capillary tip as a length along the surface of the face 25 directed radially outward from the capillary opening 55. For production bonding machines and conventional integrated circuit dies, the face width $W_F$ has generally been approximately the same size as the second bonding pad width $W_{BP}$.

In a tilting step, the capillary tip 10 is tilted at an angle theta ($\theta$) with respect to a perpendicular 75 to a surface of the second bonding pad 40 as shown in FIG. 6. The tilt angle theta ($\theta$) is preferably less than the face angle phi ($\phi$). Face angles phi ($\phi$) are generally less than about 8° for production bonding machines although other face angles are possible. In a preferred embodiment, the tilt angle theta ($\theta$) is less than about 4°.

In another preferred embodiment, the bonding capillary tip 10 is tilted generally in the direction of the ball bond 15 formed on the first bonding pad 20. In FIG. 6 a direction vector 77 points from the second bonding pad 40 to the first bonding pad 20 (not shown) having the ball bond 15. If the bonding capillary tip 10 were to have moved from the first bonding pad to the second bonding pad in a direct path during the positioning step, the capillary axis 70 would be tilted in a plane (of the page) containing the perpendicular 75 and the direction vector 77 as shown in FIG. 6.

As shown in FIG. 7, by tilting the bonding capillary tip 10, a welding step of a second end of the bonding wire 45 can now be performed without damaging the passivation layer 60. In a preferred embodiment, the welding will be performed by ultrasonic means. In this way, a bonding wire 45 will electrically connect a first bonding pad 20 of a first integrated circuit chip 30 to a second bonding pad 40 of a second integrated circuit chip 55 without the inherit corrosion and circuit damage problems of conventional techniques.

Figure 8:
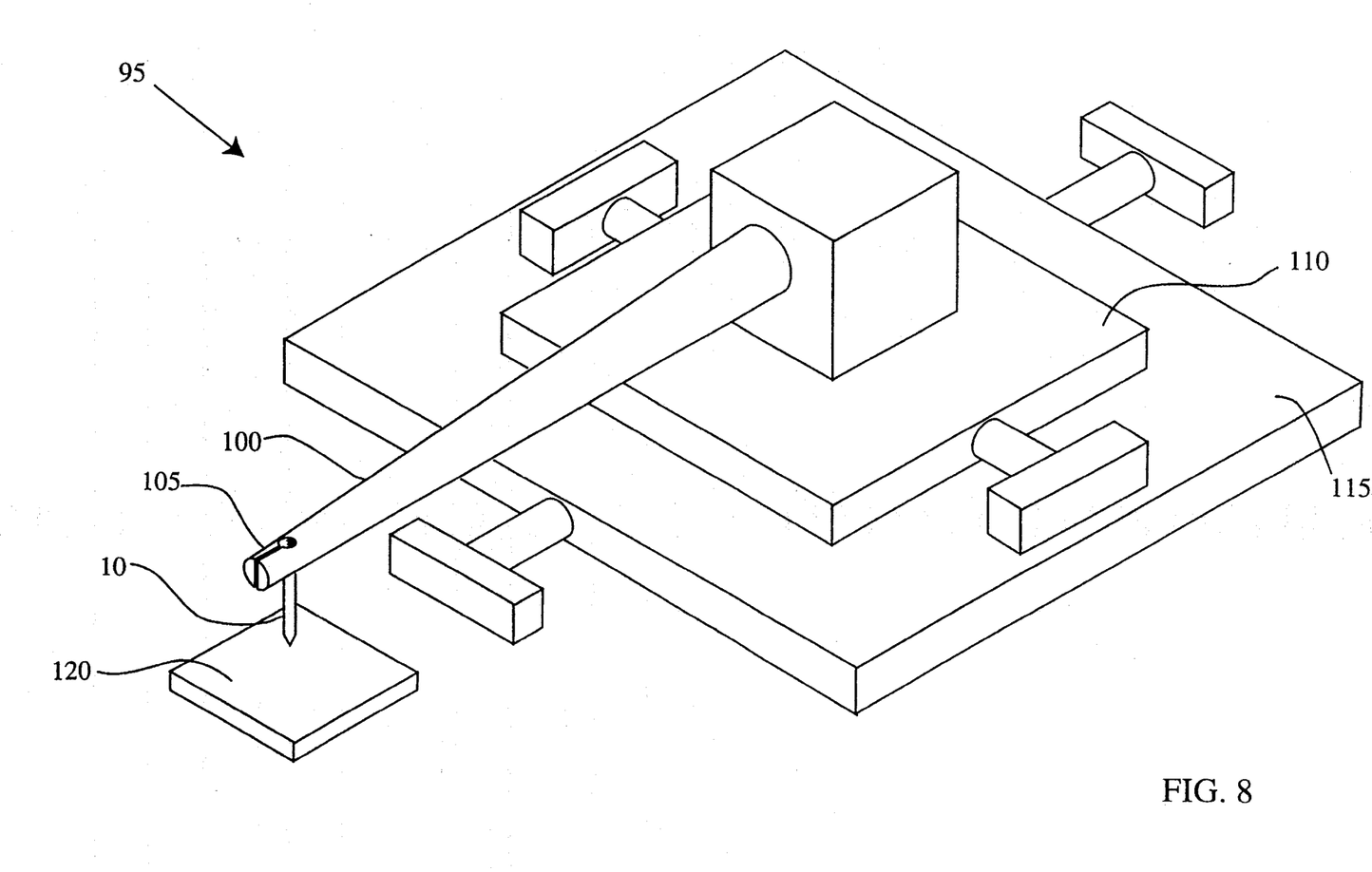
FIG. 8 is a perspective view of a representation of a wire bonding machine of the present invention.

A wire bonding apparatus 95 suitable for forming the ball bonds and the stitch bonds in accordance with the present invention is shown in FIG. 8. The wire bonding apparatus 95 includes a transducer assembly 100 and a capillary holder 105. In a preferred embodiment, the capillary holder 105 is supported by a table 110 pivotable about a first axis. In another preferred embodiment, the table 110 resides on a second table 115 which is pivotable about a second axis. The combination of the first table 110 and the second table 115 permits pivoting of the capillary holder 105 and the capillary tip 10 itself about two axes. Thus, the capillary tip 10 is angularly orientable about two axes. The transducer assembly 100 may be translated using conventional methods used by conventional wiring bonding machines.

Alternatively, a work holder 120 which supports the integrated circuit chips 30 and 55 may be pivotable about one or two axes. In this way, conventional methods for translating the transducer assembly 100 can be used in conjunction with the pivotable work holder 120.

Alternatively, other combinations of pivotal work holders 120 or pivoting tables 110 and 115 may be constructed. For example, the work holder 120 may be pivotal about a first axis and the capillary holder 105 and capillary 10 may be pivotal about a second axis by action of the table 115. Likewise, the work holder 120 may be translatable while the transducer assembly stays fixed, or the transducer assembly 100 may be translatable relative to a fixed work holder 120. Collectively, the tables 110 and 115 with the work holder 120 should be capable of angularly orienting and translating one of the capillary tip 10 and the integrated circuit bonding pads 20 and 40 relative to the other. In a preferred embodiment, a servo mechanism can be used to control the angular orientations and translations of the transducer assembly 100, the first table 110, the second table 115, and the work holder 120.

By translating the capillary tip 10 and pivoting the tip about two axes, the wire bonding apparatus 95 can form the stitch bonds 65 in two directions at various locations on integrated circuit dies 55. The wire bonding apparatus can also perform ball bonds 15 on tilted bonding pads 20 by tilting the capillary tip 10 to match the tilt of the pad 20.

Although only a few embodiments of the present invention have been described, it should be understood that the present invention may be embodied in many other specific forms without departing from the spirit or scope of the invention. Particularly, the stitch bond may not occur after tile ball bond. It is possible that the ball and stitch bonds may be performed on the same integrated circuit die instead of different ones. Although gold has been described as the wire bonding material, other suitable materials such as aluminum and copper may be used. For some applications, it may be desirable to use face angles of greater than 8° and the tilt angles of greater than 4°. Also, the support for angularly orienting and translating the capillary tip relative to the bonding pads may take a different form than the described tables or pivotal work holder. Additionally, the integrated circuit chips need not all be supported by tile same work holder, and the chips may be on other substrates such as jumper chips, connection substrates, or printed circuit boards instead a die attach pad. Other connections between integrated circuit chips such as through jumper chips and connection substrates may be used in conjunction with the bonding wires of the present invention. The face may be faceted to form in effect multiple face surfaces about the opening of the bonding capillary. Additionally, the capillary opening may have a cross section deviating from a circular one such as a square or polygonal cross section. Therefore, the present examples are to be considered as illustrative and not restrictive, and the invention is not to be limited to the details given herein, but may be modified within the scope of the appended claims.

I claim:

1. A method of bonding wires to integrated circuit bonding pads using a bonding capillary which defines an axis and has a capillary tip about an opening of the bonding capillary, the opening being aligned with the capillary axis, having a face on the tip, the face having a face surface oriented at a face angle with respect to a face plane perpendicular to the capillary axis, the method of wire bonding comprising the steps:
   positioning of the capillary tip in proximity to a second bonding pad of a second integrated circuit die;
   tilting the capillary tip with respect to a surface of the second bonding pad of the second integrated circuit die such that a tilt angle defined as an angle between the face plane and the surface of the second bonding pad is greater than zero but less than the face angle thereby substantially preventing a portion of the face surface from contacting the second integrated circuit die; and
   welding a second end of a bonding wire, exuding from the opening of the capillary, to the surface of the second bonding pad to form a stitch bond of the second end of the bonding wire to the second bonding pad;
   whereby the second end of the bonding wire is stitch bonded to the second bonding pad to connect electrically the second end of the bonding wire to the second bonding pad such that the portion of the face surface is substantially prevented from damaging the second integrated circuit die.

2. A method as recited in claim 1 wherein a diameter of said capillary tip is larger than a width of said second bonding pad surface such that said tilting step substantially prevents damage to areas on said second integrated circuit die which surround said second bonding pad.

3. A method as recited in claim 1 further comprising the steps:
   positioning said capillary tip in proximity to a first bonding pad such that the capillary axis is substantially perpendicular to a surface of the first bonding pad; and
   welding a first end of said bonding wire exuding out of said capillary opening onto the first bonding pad to form a ball bond of the first end of said bonding wire to the first bonding pad;
   wherein said positioning of said capillary tip in proximity to said second bonding pad includes a step of exuding said bonding wire out of said opening of said bonding capillary;
   whereby said bonding wire is formed to connect electrically the first bonding pad to said second bonding pad such that the first end of said bonding wire is ball bonded to the first bonding pad and said second end of the bonding wire is stitch bonded to said second bonding pad.

4. A method of wire bonding as recited in claim 3 wherein said first bonding pad is part of a first integrated circuit die.

5. A method as recited in claim 4 wherein said welding of said first end of said bonding wire to said first bonding pad occurs before said welding of said second end of said bonding wire to said second bonding pad and wherein said tilting step tilts the capillary axis toward said first bonding pad.

6. A method of wire bonding as recited in claim 5 wherein said face angle is less than about 8 degrees.

7. A method of wire bonding as recited in claim 6 wherein said tilt angle is in a range greater than 0 degrees and less than about 4 degrees.

* * * * *